(12) United States Patent
Iwana et al.

(10) Patent No.: US 10,996,243 B2
(45) Date of Patent: May 4, 2021

(54) VERTICAL PROBE AND JIG FOR VERTICAL PROBE

(71) Applicant: Probe Innovation, Inc., Hiroshima (JP)

(72) Inventors: Akiko Iwana, Hiroshima (JP); Tadashi Rokkaku, Irving, TX (US); Nobuo Iwakuni, Hiroshima (JP)

(73) Assignee: PROBE INNOVATION, INC., Hiroshima (JP)

( * ) Notice: Subject to any disclaimer, the term of this patent is extended or adjusted under 35 U.S.C. 154(b) by 32 days.

(21) Appl. No.: 16/504,170

(22) Filed: Jul. 5, 2019

(65) Prior Publication Data

US 2020/0182908 A1 Jun. 11, 2020

(30) Foreign Application Priority Data

Dec. 10, 2018 (JP) .............................. JP2018-246111

(51) Int. Cl.
*G01R 1/073* (2006.01)
*G01R 31/28* (2006.01)
*G01R 31/50* (2020.01)

(52) U.S. Cl.
CPC ..... *G01R 1/07371* (2013.01); *G01R 31/2887* (2013.01); *G01R 31/50* (2020.01)

(58) Field of Classification Search
CPC ............... G01R 1/07371; G01R 31/50; G01R 31/2887; G01R 1/07357
USPC .................................... 324/755.01, 537, 500
See application file for complete search history.

(56) References Cited

U.S. PATENT DOCUMENTS

| 4,963,822 | A | * | 10/1990 | Prokopp | ............ | G01R 1/07328 |
| | | | | | | 324/72.5 |
| 5,218,292 | A | * | 6/1993 | Goto | .................. | G01R 31/2851 |
| | | | | | | 324/750.29 |
| 6,853,208 | B2 | * | 2/2005 | Okubo | ...................... | G01R 3/00 |
| | | | | | | 324/756.03 |
| 8,222,912 | B2 | * | 7/2012 | Dang | ................... | G01R 1/0675 |
| | | | | | | 324/755.01 |
| 9,248,522 | B2 | * | 2/2016 | Saitou | .................. | B23K 20/126 |
| 2003/0173949 | A1 | * | 9/2003 | Hwang | .............. | G01R 31/2893 |
| | | | | | | 324/750.19 |
| 2010/0231923 | A1 | * | 9/2010 | Ge | ........................ | G01M 11/025 |
| | | | | | | 356/511 |
| 2012/0101757 | A1 | * | 4/2012 | Morancho Rodriguez et al. ........ |
| | | | | | | G01B 21/20 |
| | | | | | | 702/81 |
| 2013/0106453 | A1 | * | 5/2013 | Ikegami | ............... | G01R 31/129 |
| | | | | | | 324/750.19 |

(Continued)

*Primary Examiner* — Giovanni Astacio-Oquendo
(74) *Attorney, Agent, or Firm* — Masuvalley & Partners

(57) ABSTRACT

The present invention is intended to provide a vertical probe and a jig which has sufficient flexibility for contact reaction force from the electrical contact to be inspected, easy insertion and assembly of the probe even with narrow pitch, and enables cost reduction and delivery time reduction, wherein means for driving and positioning relative positions of upper and lower hole plates is provided, the straight pins as materials of vertical probes are inserted into the upper and lower hole plates, plastic deformation is applied to the straight pin by driving and positioning the relative position of the upper and lower hole plates, a symmetrical arched shape is provided, and a bending point is formed in the vicinity of the lower side of the upper hole plate and in the vicinity of the upper side of the lower hole plate.

3 Claims, 14 Drawing Sheets

(56) References Cited

U.S. PATENT DOCUMENTS

2014/0183245 A1\* 7/2014 Yamaguchi .......... B23K 20/127
228/2.1
2015/0253358 A1\* 9/2015 Chen ........................ G01R 3/00
29/825

\* cited by examiner

Enlarged view of the U part

Enlarged view of the V part

Enlarged view of the U part

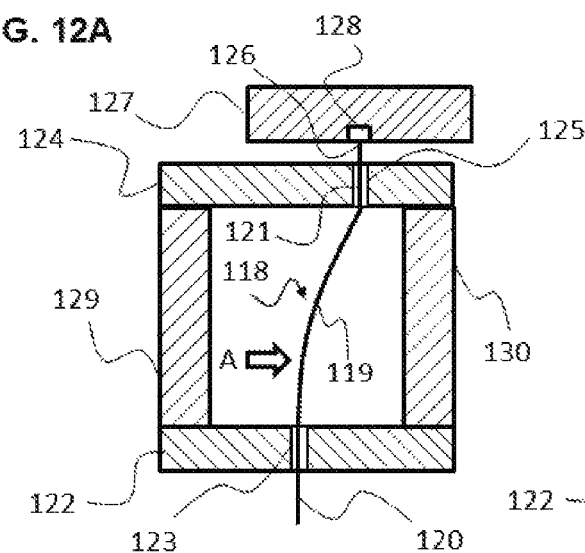
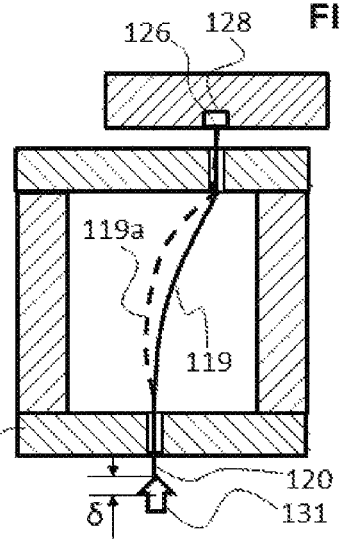
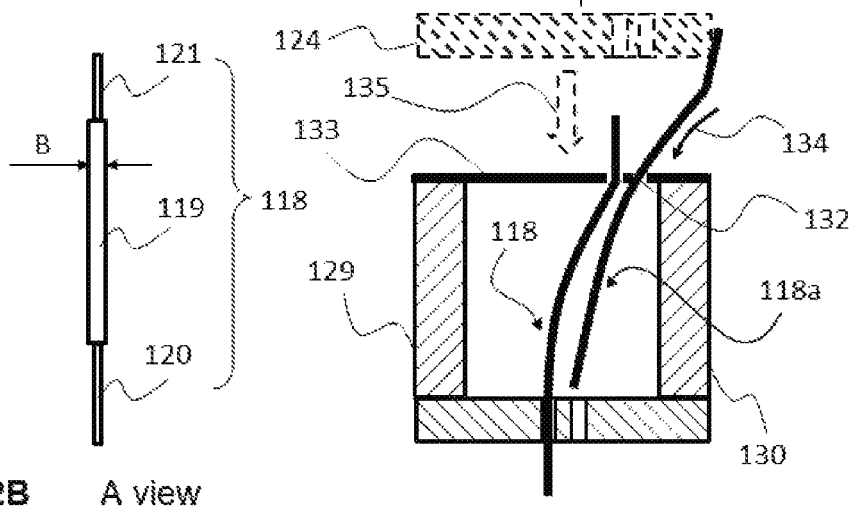
FIG. 12A
FIG. 12B  A view
FIG. 12C
FIG. 12D

VERTICAL PROBE AND JIG FOR VERTICAL PROBE

RELATED APPLICATION

This application claims priority under 35 U.S.C. § 119 from Japanese patent application Serial No. 2018-246111, filed Dec. 10, 2018, entitled "Vertical Probe And Jig For Vertical Probe", which is incorporated herein by reference in its entirety.

FIELD OF THE INVENTION

The present invention relates to a vertical probe and a jig for vertical probes for performing an electric inspection of a semiconductor device on a wafer and an electric inspection of an electronic components.

BACKGROUND

With the trend of the miniaturization and refinement of semiconductor devices, semiconductor integrated circuits are becoming increasingly dense and narrow pitch, and vertical probes and jigs for vertical probes for performing an electric inspection are also becoming increasingly narrow pitch.

However, in the vertical probe in the prior art, the limitation of narrowing pitch has been reached if only by reducing the probe diameter. One of the reasons is that, when a stopper for preventing the vertical probe from falling is provided by coating or crushing treatment, the thickness of coating film or the crushing treatment parts become an obstacle to narrowing the pitch.

In addition, if the probe is shaped to have a stopper function so as to eliminate the need for a coating or a crushing treatment part which is an obstacle to narrowing the pitch, the shape of the probe is not simple, and it is difficult to incorporate the probe into a jig to achieve a narrow pitch.

The defects of the vertical probe in the prior art and the jig for the vertical probe will be described according to specific examples shown in FIG. 11A to FIG. 14C as following.

FIGS. 11A and 11B are an explanatory view of the structure and operation of a vertical probe called a wire probe. As shown in FIG. 11A, a wire probe 101 comprises an insulating coating 102, wherein the upper part of the insulating coating 102 is inserted into the through hole 104 of the upper hole plate 103.

The lower part 105 of the wire probe 101 penetrates through the through hole 107 of the lower hole plate 106, and the lower end 108 is in contact with the electrode pad 110 of the electronic device 109. An upper end 113 of the wire probe 101 protruding from the upper hole plate 103 is in contact with an electrode 115 of a printed circuit board for inspection.

The upper hole plate 103 and the lower hole plate 106 are connected and positioned via connecting members 111 and 112 by bolts and positioning pins (not shown). Besides it, the electronic device 109 is positioned on a table (not shown).

As shown in FIG. 11B, when the table (not shown) to which the electronic device 109 is attached is raised in the direction indicated by the arrow 116, the wire probe 101 is buckled, and is deformed into an arch as shown by the broken line 117.

The wire probe shown in FIGS. 11A and 11B are difficult to achieve narrow pitch due to the following reasons. That is because the insulating coating 102 provided for preventing the wire probe 101 from falling is an obstacle to narrowing the pitch. As shown in FIG. 11B, when the wire probe 101 and 101a are adjacent to each other by a narrow pitch, the thickness of the wall 117 between the through hole 104 and 104a of the upper hole plate becomes so thin that it cannot be manufactured due to the presence of the insulating coating.

The structure and operation of a vertical probe called a cobra will be described according to FIGS. 12A to 12D as following. In FIG. 12A, the cobra 118 of the vertical probe is composed of a bending part 119, a lower straight part 120, and an upper straight part 121.

The lower straight port 120 penetrates through the through hole 123 of the lower hole plate 122 and is in contact with the electrode pad of the electronic device (not shown). The upper straight part 121 penetrates through the through hole 125 of the upper hole plate 124, and its upper end 126 is in contact with the inspection electrode 128 of the printed circuit board 127. The upper hole plate 124 and the lower hole plate 122 are connected via connecting members 129 and 130.

FIG. 12B) is a view of the cobra 118 seen from the direction shown by the arrow A in FIG. 12A, the bending part 119 is reduced in thickness to increase flexibility by pressing, and has a width B so as to be wide, and serves as a stopper for preventing the falling from the through hole 123.

FIG. 12C shows that the lower straight portion 120 is moved by the overdrive indicated by δ under the contact force from the direction shown by the arrow 131 from the electrode pad of the electronic device (not shown), and that the bending part 119 is deformed by a broken line 119a. As a result, the upper end 126 is in contact with the inspection electrode 128 with certainty.

FIG. 12D shows the procedure for assembling the cobra 118 and the cobra 118a adjacent thereto. Since the shape of the cobra is complicated, it is difficult to insert the adjacent cobras 118 and 118a from above the upper hole plate 124 in the case of a narrow pitch, so that a method is employed in which a thin film 133 having a plurality of holes 132 is placed on the connecting members 129 and 130, the cobras 118 and 118a are moved in the direction indicated by the arrow 134, then assembled sequentially through the holes 132, and finally the upper hole plate 124 shown by a broken line is moved in the direction of the arrow 135 and attached together with the thin film 133.

When applying the cobra which is the vertical probe described in FIGS. 12A to 12D to a narrow pitch device, there are the following difficulties.

First, since the bending part 119 has a width B, there is a narrow pitch limit to avoid interference with adjacent cobras. Second, as shown in FIG. 12D, the complicated shape causes interference with the tangential cobra, making assembly difficult in the case of a narrow pitch.

Furthermore, in order to divert in another explanation mentioned later, the contact force and overdrive characteristics of the cobra of the vertical probe shown in FIGS. 12A to 12D are shown in FIG. 13.

As shown in FIG. 13, in the cobra, the relationship between overdrive and contact force has relatively good linearity.

In recent years, a convenient method has been employed in which a straight pin is bent and deformed to prevent falling and to reduce the pitch. The example is demonstrated according to FIGS. 14A to 14C. In FIG. 14A, the straight pin 136 penetrates through the through hole 138 of the upper hole plate 137, the through hole 140 of the middle hole plate 139, and the through hole 142 of the lower hole plate 141. The upper hole plate 137, the middle hole plate 139 and the lower hole plate 141 are connected by holding members 143 and 144.

In the state shown in FIG. 14A, since the straight pin 136 falls by gravity, the fall prevention is achieved by a convenient method as shown in FIG. 14B. In FIG. 14B, the middle hole plate 139 is moved by a fixed amount in the direction shown by the arrow 145, and the straight pin 136 is subjected to bending deformation to form a bending vertical probe 146. The bending vertical probe 146 receives the reaction force from the edge parts of the through holes 140 and 142 and is prevented from falling.

FIG. 14C shows a state that the lower end of the bending vertical probe 146 receives a contact force 147 from an electrode pad of an electronic device (not shown), the bending vertical probe 146 is deformed as shown by a broken line 148, and the upper end is in contact with the inspection electrode 150 of the printed circuit board 149, and an electrical continuity inspection is performed.

The method shown in FIGS. 14A to 14C has the following difficulties in responding to the narrowing pitch.

The first difficulty is that the straight pin 136 must penetrates through the three holes of the through hole 138 of the upper hole plate, the through hole 140 of the middle hole plate, and the through hole 142 of the lower hole plate, however, if the straightness of the straight pin 136 is insufficient, it is difficult to penetrate. Practically, the diameter gap between the straight pin 136 and the through holes 138, 140 and 142 is required to be several microns or less, and the straightness of the straight pin 136 requires a straightness error of 2 microns or less per 10 mm. Therefore, the yield of the straight pins 136 is low.

The second difficulty is the inability to ensure a sufficient allowable displacement i.e. overdrive for the contact force applied to the lower end of the probe. As described in FIG. 14B, the bending vertical probe 146 is given bending deformation to prevent it from falling, but additionally, since the contact force 147 shown in FIG. 14C causes bending deformation, a large overdrive cannot be secured.

That is, in the vertical probe in the prior art, the following difficulties inhibit narrowing of the pitch.
(1) Due to the insulating coating also functions as a stopper for preventing falling, the thickness of the insulating coating inhibits narrowing of the pitch.
(2) Due to the complexity of the shape of the vertical probe, narrowing the pitch makes it difficult to assemble due to interference with adjacent probes.
(3) A straight vertical pin with high straightness accuracy is required.
(4) Sufficient overstroke cannot be secured.

SUMMARY OF THE INVENTION

The present invention has been made in view of the problems of the vertical probe in the prior art described above, and is intended to provide a vertical probe and a jig which has sufficient flexibility for contact reaction force from the electrical contact of the inspection object, easy insertion and assembly of the probe even with narrow pitch, and enables cost reduction and delivery time reduction.

A vertical probe and jig for electrical continuity inspection are provided according to claim 1 and claim 2 of the present invention, wherein means for driving and positioning relative positions of upper and lower hole plates is provided, the upper and lower ends of straight pins as materials of vertical probes are restricted through the through holes provided in the upper and lower hole plates, the positions of the upper and lower hole plates are relatively moved and positioned to plastically deform the straight pins and to make the vertical probe between the upper and lower hole plates is formed into an arched shape, and a vertical probe having a bending point due to plastic deformation is formed in the vicinity of the lower side of the upper hole plate and in the vicinity of the upper side of the lower hole plate.

The vertical probe and jig according to the present invention bring about the following advantageous effects.

(1) Facilitating the handling of narrow pitch.
The vertical probe according to the present invention does not need the insulating coating for preventing falling, so the insulating coating film having a large thickness does not hinder narrow pitch applications. Further, the probe before being inserted into the jig is a straight pin and can be inserted easily even in the case of a narrow pitch. Also, even if the shape of the probe is changed by plastic deformation inside the jig, all adjacent probes are deformed to the same shape, and interference between adjacent probes does not occur.

(2) Realizing cost reduction and delivery time reduction.
The material of the vertical probe is a straight pin, and since the deformation to the vertical probe is also performed inside the jig, cost reduction and delivery time reduction are possible.

(3) Ensuring a sufficient flexibility to the contact reaction force from the electrical contact to be inspected, and a sufficient overdrive.
In the vertical probe according to the present invention, the flexible part has an arched shape. This shape is similar to the shape of the vertical probe cobra described above, and the relationship between the contact force and the overdrive is good in linearity, and sufficient overdrive can be ensured.

BRIEF DESCRIPTION OF THE DRAWINGS

FIGS. 12A, 12B, 12C and 12D are explanatory views of the structure and operation of a vertical probe called a cobra, to illustrate configuration and problems of the vertical probe in the prior art.

Hereinafter, embodiments of the present invention will be described in detail with reference to the drawings.

One embodiment based on the present invention will be described according to FIG. 1 to FIG. 10.

DESCRIPTION OF EMBODIMENTS

Figure 1:
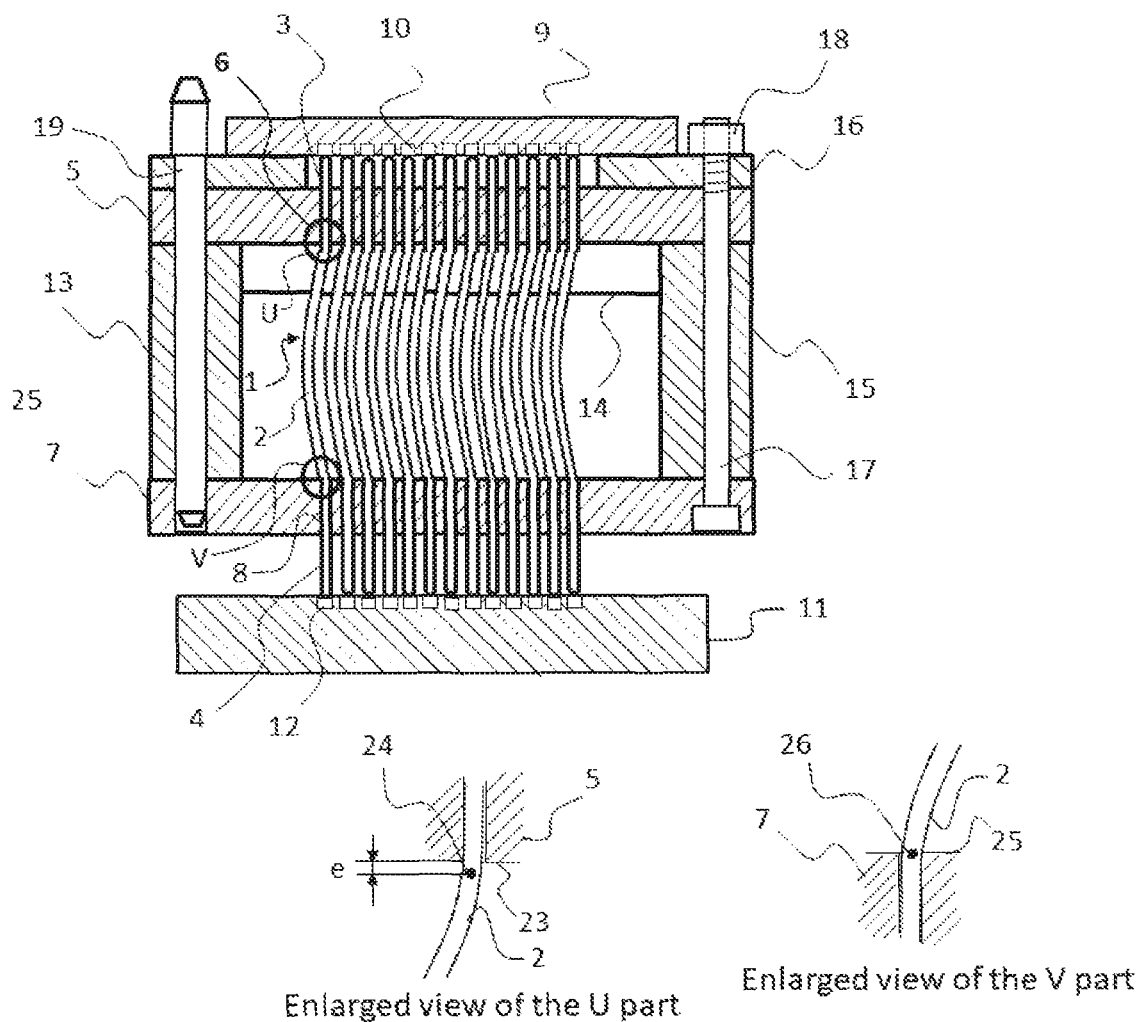
FIG. 1 is a block diagram of a jig incorporating a vertical probe according to the present invention.

FIG. 1 shows a view in which the vertical probe of claim 2 is incorporated by the vertical probe jig of claim 1 of the present invention. In the same drawing, the vertical probes 1 arranged at a plurality of equal pitches are composed of an arch shaped central part 2, an upper straight part 3, and a lower straight part 4.

The upper straight part 3 penetrates a plurality of through holes 6 provided in the upper hole plate 5, and the upper end is in contact with a plurality of inspection electrodes 10 provided on the lower surface of the printed circuit board 9. Further the lower straight part 4 penetrates a plurality of through holes 8 provided in the lower hole plate 7, and the lower end is in contact with the inspection electrode 12 provided on the upper surface of the print electronic device 11.

A hollow disk-like spacer 16 is provided on the upper hole plate 5, the lower hole plate 7, the upper hole plate 5 and the spacer 16 are connected to the connecting members 13 and 15 by a plurality of bolts 17 and nuts 18. The connecting members 13 and 15 are integrally formed with the connecting member 14. The spacer 16, the upper hole plate 5, the connecting members 13, 14, 15 and the lower hole plate 7 are positioned by two positioning pins 19 (although only one is shown).

The enlarged view of the U part and the enlarged view of the V part of FIG. 1 respectively shows an enlarged view of the central part 2 of the arched shape of the vertical probe 1 in the vicinity of the lower surface of the upper hole plate 5, and an enlarged view of the central part 2 in the vicinity of the upper surface of the lower hole plate 7.

In the enlarged view of the U part of the same figure, a bending point 24 due to plastic deformation is provided on the central part 2 separated by a minute distance e from the lower surface 23 of the upper hole plate 5. Further, in the enlarged view of the V part of the same figure, a bending point 26 due to plastic deformation is provided on the central part 2 in the plane of the upper surface 25 of the lower hole plate 7.

Figure 2:
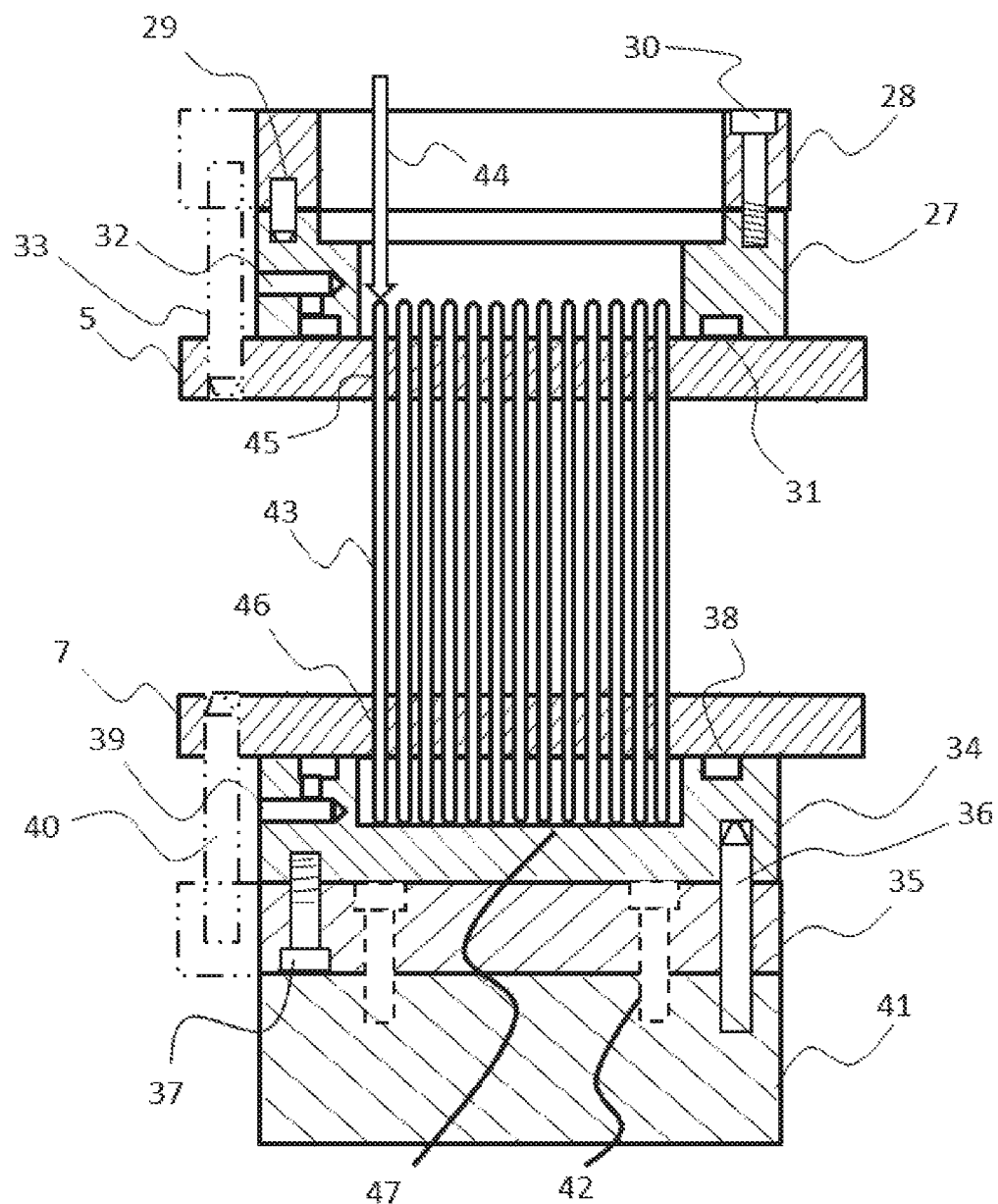
FIG. 2 is an explanatory view of the configuration of the jig according to the present invention and the process of plastically deforming the straight pin inside the jig.

Hereinafter, the manufacturing process of the vertical probe 1 shown in FIG. 1 will be described according to FIG. 2 to FIG. 10. In FIG. 2, the disk-like upper suction plate 27 is attached to the holding member 28 and is positioned by two positioning pins 29 (although only one is shown) and fixed by a plurality of bolts 30.

An annular suction groove 31 is formed on the lower surface of the upper suction plate 27, and air in the suction groove is evacuated through the exhaust hole 32. The upper hole plate 5 is attracted to the lower surface of the upper suction plate 27 and positioned by two positioning pins 33. The positioning pins 33 are illustrated on the left side for the sake of convenience, but in actuality, two positioning pins are disposed in front of and behind the central part.

The disk-like lower suction plate 34 is attached to the support plate 35, positioned by two positioning pins 36 (although only one is shown), and fixed by a plurality of bolts 37.

An annular suction groove 38 is formed on the upper surface of the lower suction plate 34, and air in the suction groove is evacuated through the exhaust hole 39. The lower hole plate 7 is attracted to the upper surface of the lower suction plate 34 and positioned by two positioning pins 40. The positioning pins 40 are illustrated on the left side for the sake of convenience, but in actuality, two positioning pins are disposed in front of and behind the central part.

The support plate 35 is attached to the XYZ table 41, positioned by two positioning pins 36 (although only one is shown), and fixed by a plurality of bolts 42.

A plurality of straight pins 43 are inserted from the direction of arrow 44, penetrate through the plurality of through holes 45 of the upper hole plate and the plurality of through holes 46 of the lower hole plate 7, and to the depression bottom surface 47 of the lower suction plate 34.

The XYZ table 41 is moved and positioned in the left-right direction of the paper surface and in the front-rear direction of the paper surface so that the alignment accuracy of the upper and lower through holes 45 and 46 can be secured. Further, as described later, by moving in the axial direction of the straight pin 43, plastic deformation is given to the straight pin, and residual stress can be released after plastic deformation.

Figure 3:
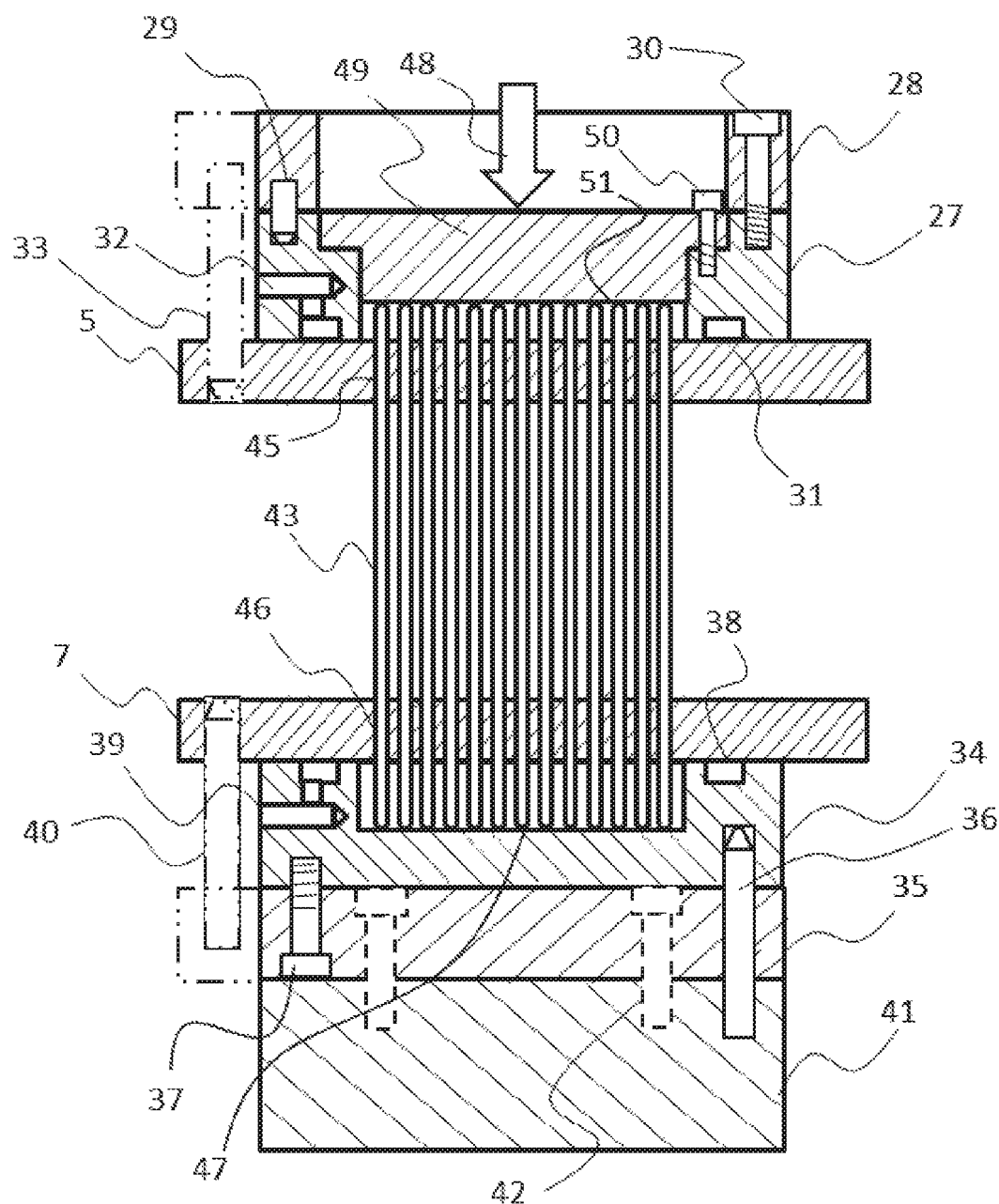
FIG. 3 is an explanatory view of the configuration of the jig according to the present invention and the process of plastically deforming the straight pin inside the jig.

In FIG. 3, in the direction indicated by the arrow 48, the probe pressing member 49 is attached to the upper suction plate 27 and fixed by a plurality of bolts 50. The lower surface 51 of the probe pressing member 49 is in contact with the upper end part of the plurality of straight pins 43, and the plurality of straight pins 43 are vertically constrained between the bottom surface 47 of the lower suction plate 34.

Figure 4:
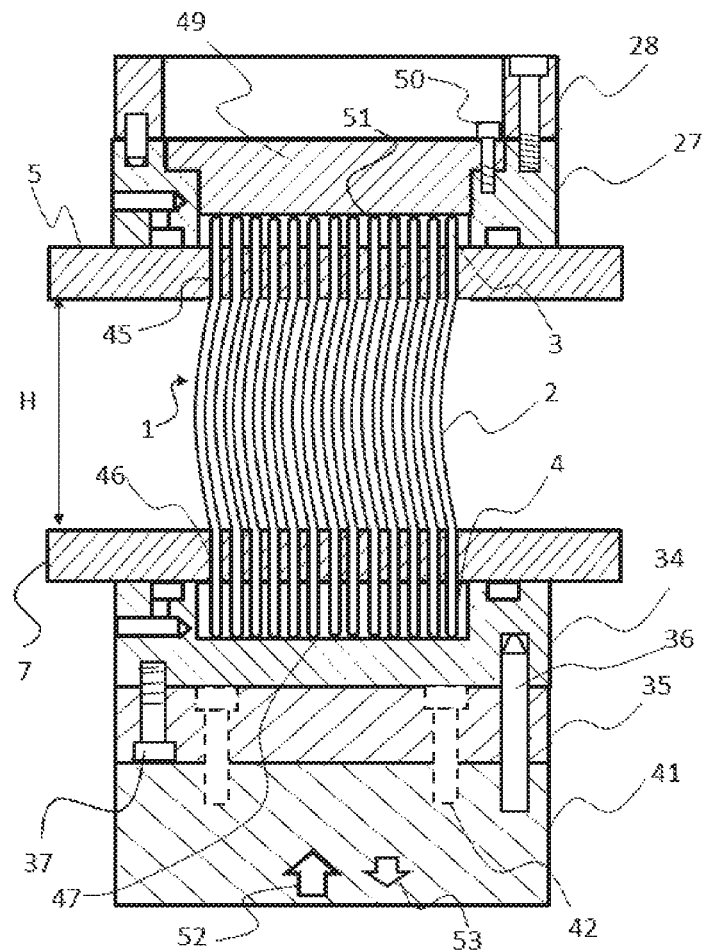
FIG. 4 is an explanatory view of the configuration of the jig according to the present invention and the process of plastically deforming the straight pin inside the jig.
Figure 4:
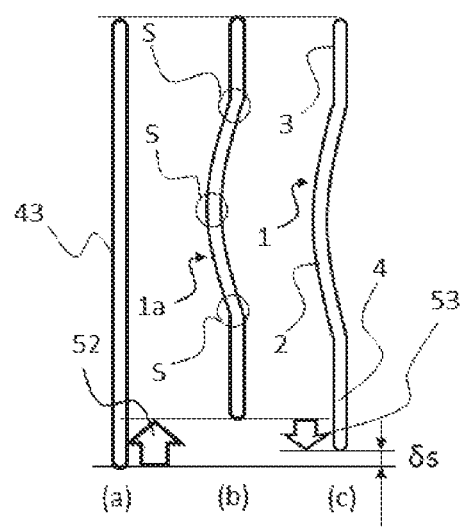

FIG. 4 shows a process of plastically deforming the central part of the straight pin 43 shown in FIG. 3 into a curved shape. After the XYZ table 41 shown (a) in FIG. 4 is moved in the direction shown by the arrow 52 to plastically deform the straight pin 43 into a curved shape as shown by the vertical pin 1a, when the XYZ table 41 is moved in the direction of the arrow 53 to release the residual stress of the vertical pin 1a, the shape of the vertical probe 1 is obtained.

In FIG. 4, the plurality of vertical probes 1 are also arranged in the same direction in order, and are deformed in the same amount so as not to interfere with each other. Usually, the deformation of the plurality of vertical probes 1 results in random directions. However, they can be deformed in the same direction in order by the following method in practice.

Before the XYZ table 41 is pushed upward and the straight pin 43 is buckled and deformed, and after the XYZ table 41 is shifted by a slight amount in the left and right direction, for example, 0.2 mm in the left direction, when pushed upward, the plurality of straight pins 43 have a curved shape on the left side, and perform regular buckling deformation.

Figure 5:
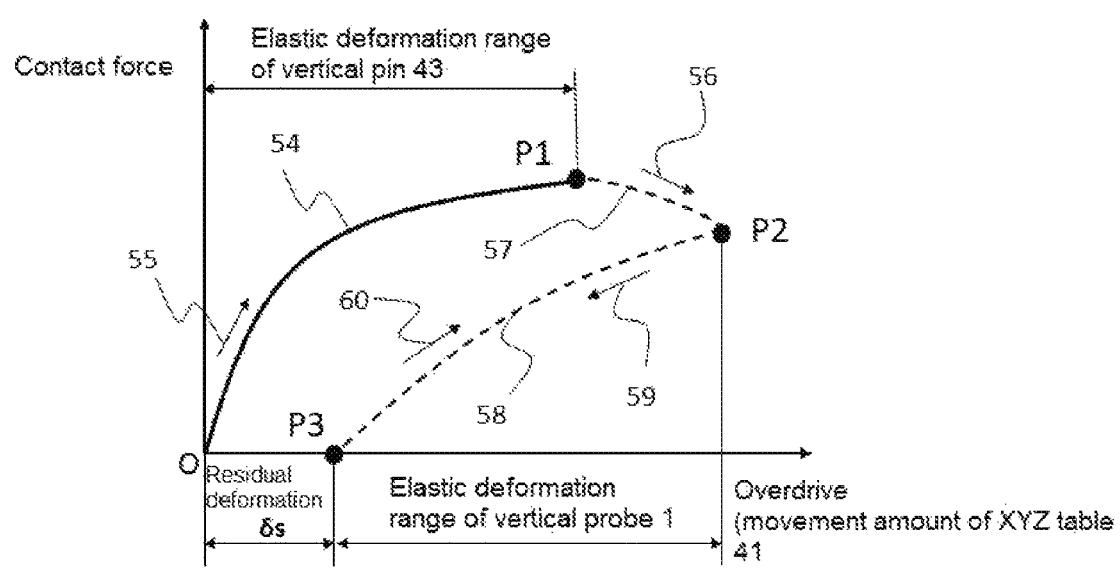
FIG. 5 is an explanatory view of the configuration of the jig according to the present invention and the process of plastically deforming the straight pin inside the jig.

As shown in (c) in FIG. 4, the vertical probe 1 has a residual strain δs in the axial direction with respect to the vertical pin 43 and has a short length. FIG. 5 shows the deformation process described above in the relationship between a contact force which is an axial force and an overstroke which is an axial pressing amount.

In the state of the upper and lower ends of the vertical pin 43 shown in FIG. 3 are restrained by the lower surface 51 of the probe pressing member 49 and the bottom surface 47 of the depressed portion of the lower suction plate 34, when a compressive force is applied in the axial direction, the contact force/overdrive characteristic is exhibited as shown by the curve 54 in FIG. 5. In the initial stage, the contact force rapidly increases as shown by the arrow 55, but when the vertical pin 43 causes buckling deformation, the slope of the curve 54 becomes gentle.

When the contact force shown in FIG. 5 increases and reaches point P1, the vertical pin 43 has a shape shown by the vertical probe 1a shown in FIG. 4 and causes plastic deformation in a region indicated by S where stress is large, but the other curved parts are within the elastic limit.

In FIG. 5, when the overstroke is further increased beyond the point P1 where plastic deformation starts to partially occur, in other words, when the XYZ table 41 of FIG. 4 is further pushed up, by moving on the dashed curve 57 in the direction shown by the arrow 56, the overstroke becomes large, and when it reaches the point P2, it becomes the shape of the vertical probe 1 of (c) in FIG. 4.

In FIG. 5, when the overdrive is further lowered from the point P2, in other words, in FIG. 4, when the XYZ table 41 is moved downward, it moves in the direction of the arrow 59 along the curve 58 of FIG. 5 to the point P2 where the residual deformation δs is left. The state of this point P2 corresponds to the state of (c) in FIG. 4.

In FIG. 4, the curve 54 is a non-linear curve, but the curve 58 is a curve having a relatively good linearity. The reason is as follows.

The curve 54 shows the contact force and overdrive characteristics when the straight pin 43 is subjected to an axial contact force to cause buckling deformation. Therefore, a large contact force is required until the straight pin 43 starts the buckling deformation, but after the buckling deformation occurs, the overdrive becomes large even if the contact force is not largely increased. As a result, the curve 54 has strong non-linearity.

Figure 13:
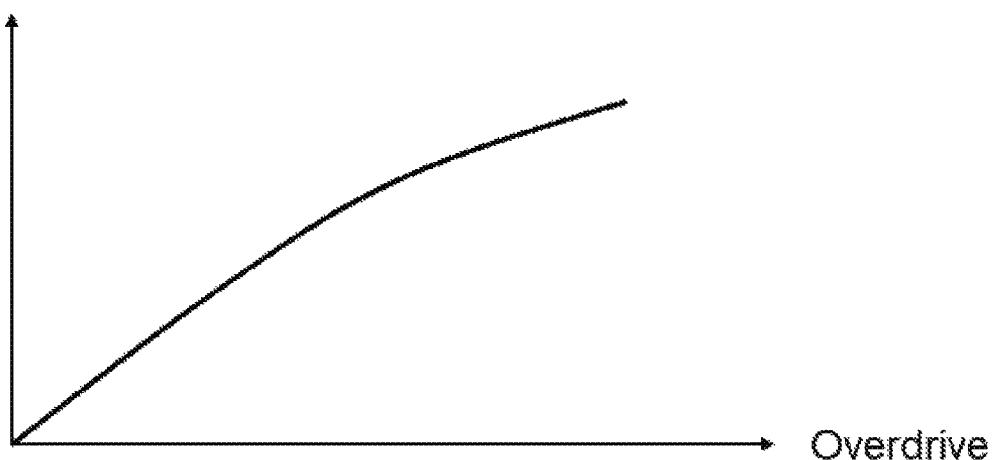
FIG. 13 is a characteristic explanatory view of contact force and overdrive of the cobra of the vertical probe.
Figure 14A:
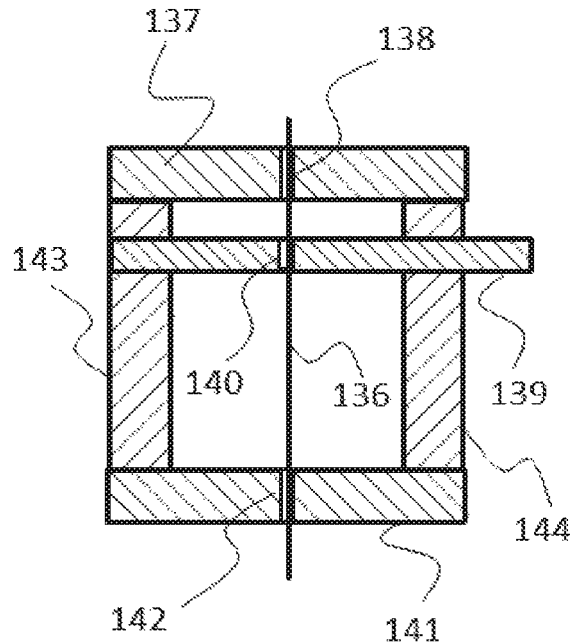
FIGS. 14A, 14B and 14C are explanatory views of the prior art example using an expedient method in which a straight pin is bent and deformed to prevent falling and to reduce the pitch, to illustrate configuration and problems of the vertical probe in the prior art.
Figure 14B:
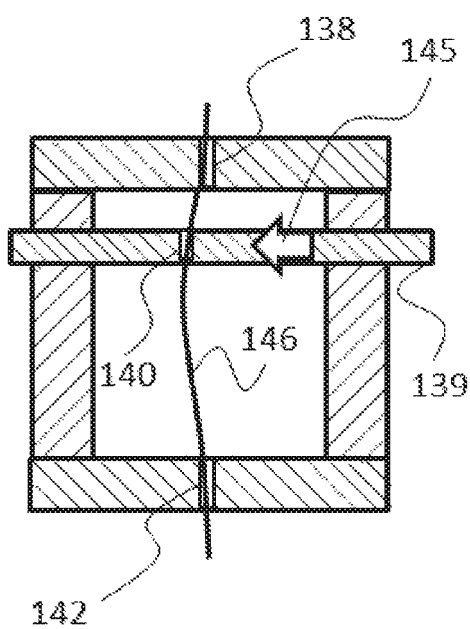
Figure 14C:
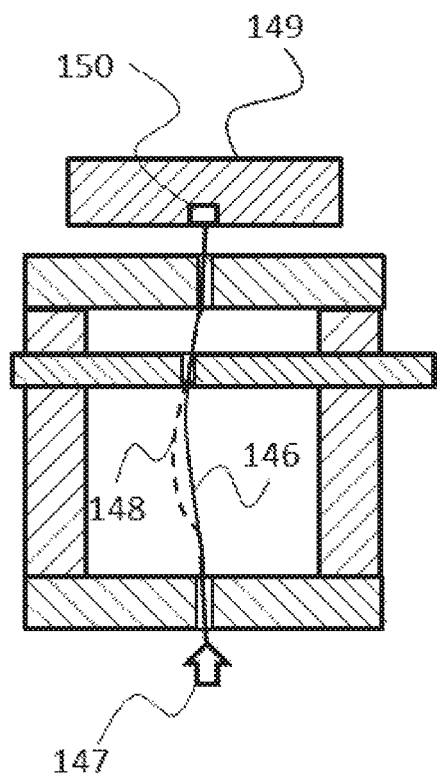

The curve 58 in FIG. 5 shows the contact force and overdrive characteristics of the vertical probe 1 shown (c) in FIG. 4 which has been plastically deformed, in the state of point P3 in FIG. 5, the arch shaped central part 2 is provided, and no buckling deformation occurs. The arch shaped central part 2 has a curved shape similar to that of the vertical probe cobra described in FIGS. 12A to 12D. Therefore, the contact force and overdrive characteristics also have the curve 58 of FIG. 5 in the good linearity characteristics shown in FIG. 13.

That is, the vertical probe 1 shown in FIG. 4 has an elastic deformation range between the point P3 and the point P2 in the curve 58 of FIG. 5, and reciprocates in the directions of the arrow 60 and the arrow 59 and has contact force and overdrive characteristics with a relatively large range of linearity.

Figure 6:
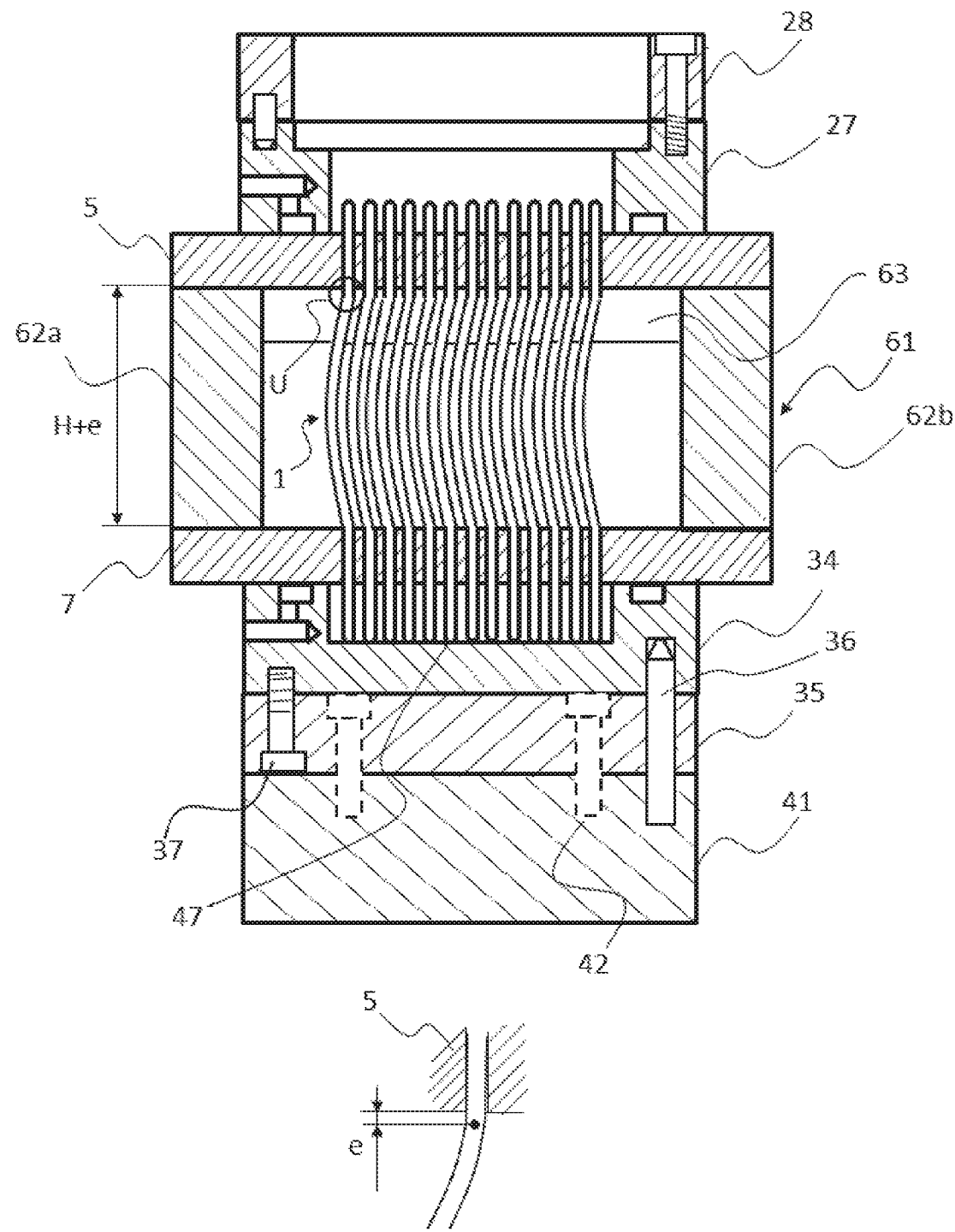
FIG. 6 is an explanatory view of the configuration of the jig according to the present invention and the process of plastically deforming the straight pin inside the jig.

FIG. 6 shows a state in which a plurality of bolts 50 and the probe pressing member 49 in FIG. 4 are removed, and the connecting member 61 is inserted between the upper hole plate 5 and the lower hole plate 7 from the back of the paper surface.

The left connecting member 62a and the right connecting member 62b of the connecting member 61 are integrally connected by a central connecting member 63. Further, before the connecting member 61 is inserted, the XYZ table 41 is moved by a small amount downward to secure a sufficient insertion gap.

Further in FIG. 4, the distance between the upper and lower hole plates in FIG. 6 is H+e with respect to the distance H between the upper and lower hole plates when the vertical probe 1 is molded, and as shown in the enlarged view of the U part of the same drawing, the bending point 24 due to plastic deformation is moved from the lower surface of the upper hole plate 5 to the position of the distance e.

Figure 7:
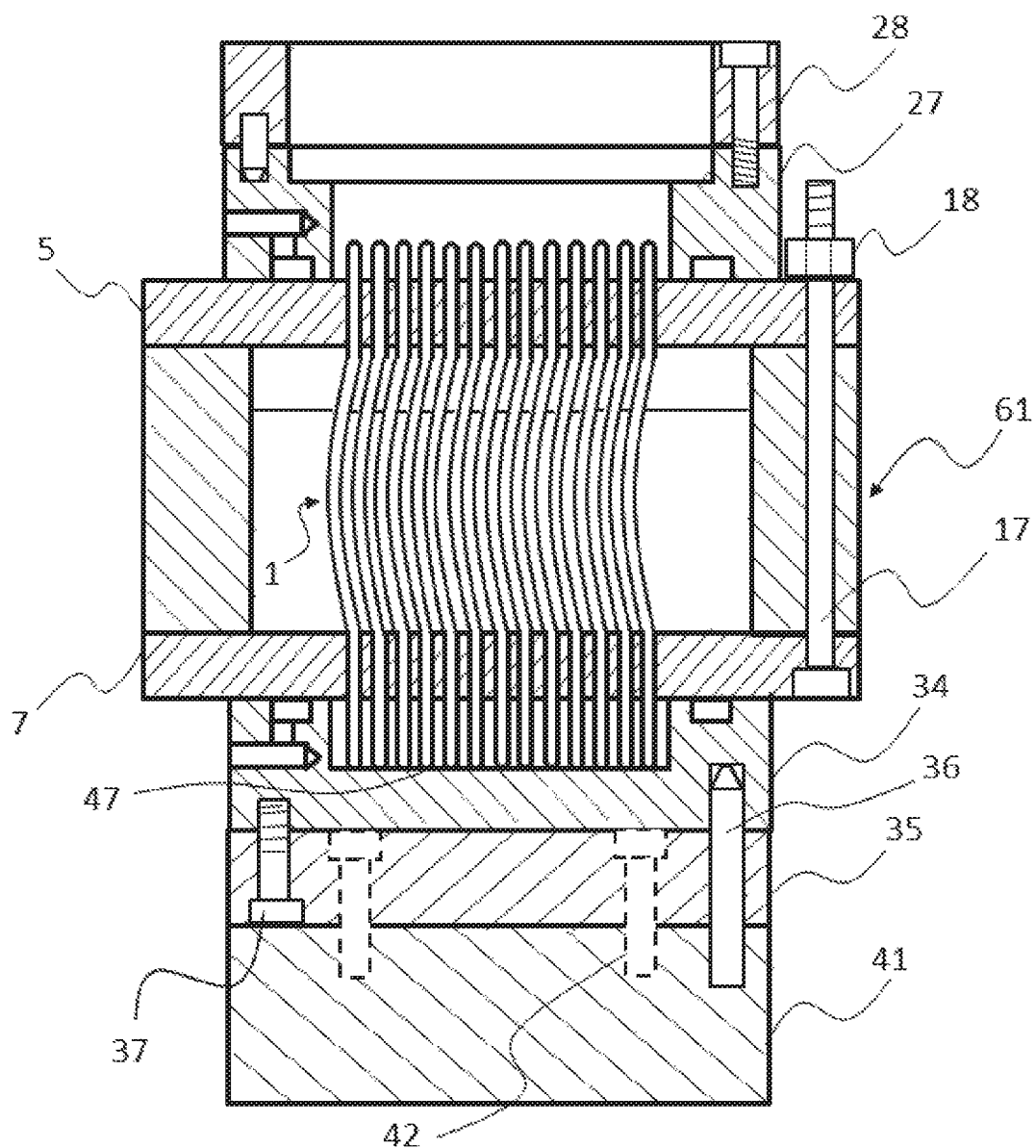
FIG. 7 is an explanatory view of the configuration of the jig according to the present invention and the process of plastically deforming the straight pin inside the jig.

FIG. 7 shows a state in which after inserting the connecting member 61 between the upper hole plate 5 and the lower hole plate 7, the upper hole plate 5, the lower hole plate 7, and the connecting member 61 are temporarily attached by a plurality of bolts 17 and nuts 18.

Figure 8:
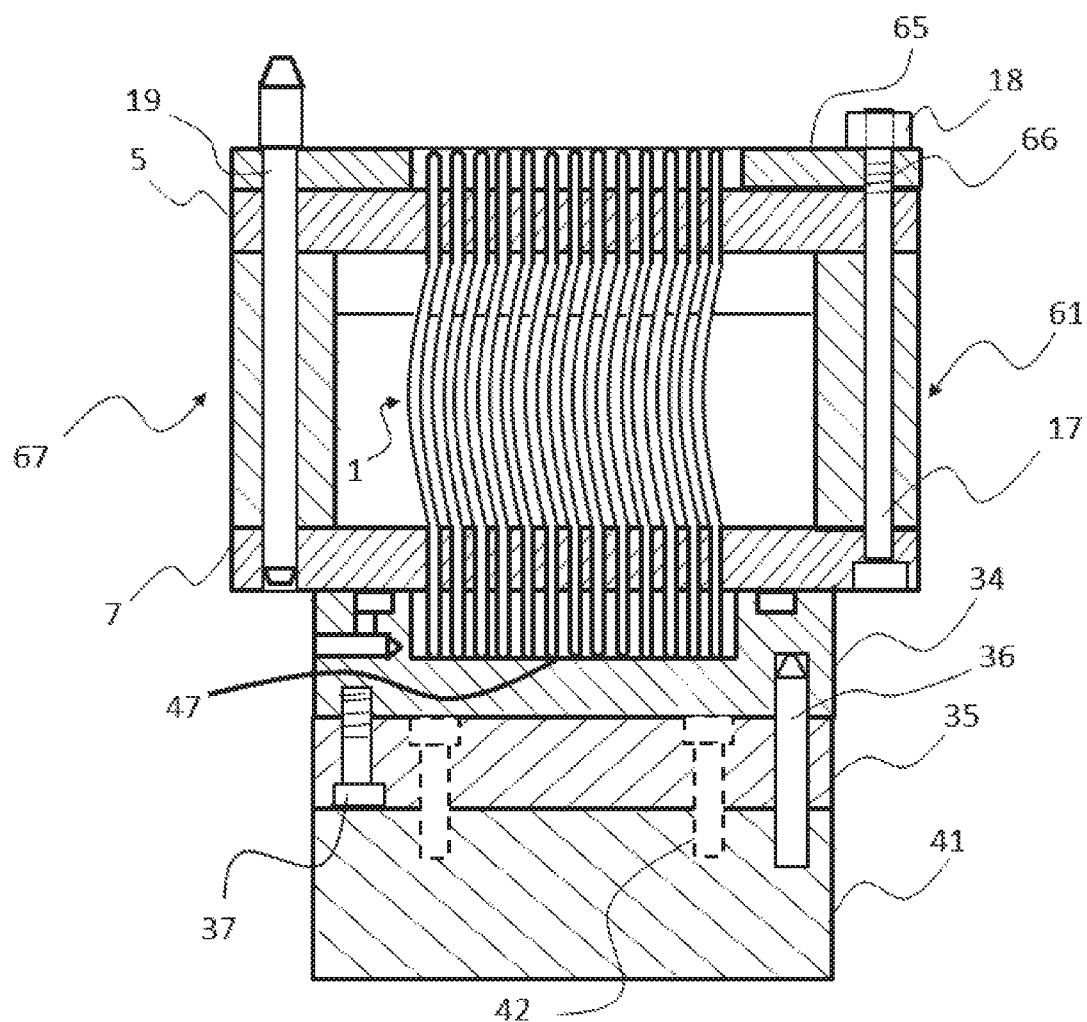
FIG. 8 is an explanatory view of the configuration of the jig according to the present invention and the process of plastically deforming the straight pin inside the jig.

After stopping the vacuum suction of the upper suction plate 27 in FIG. 7, the XYZ table 41 is moved downward, and the assembly shown in FIG. 8 is performed.

In FIG. 8, a spacer 65 having a disk-like shape is positioned by two positioning pins 19 (although only one is shown) with respect to the upper hole plate 5, the connecting member 61 and the lower hole plate 7. Further, the plurality of bolts 17 are screwed into the screw holes 66 of the spacer 65, and together with the nuts 18 constitute a double nut so that the bolts 17 are unlikely to be loosened.

Figure 9:
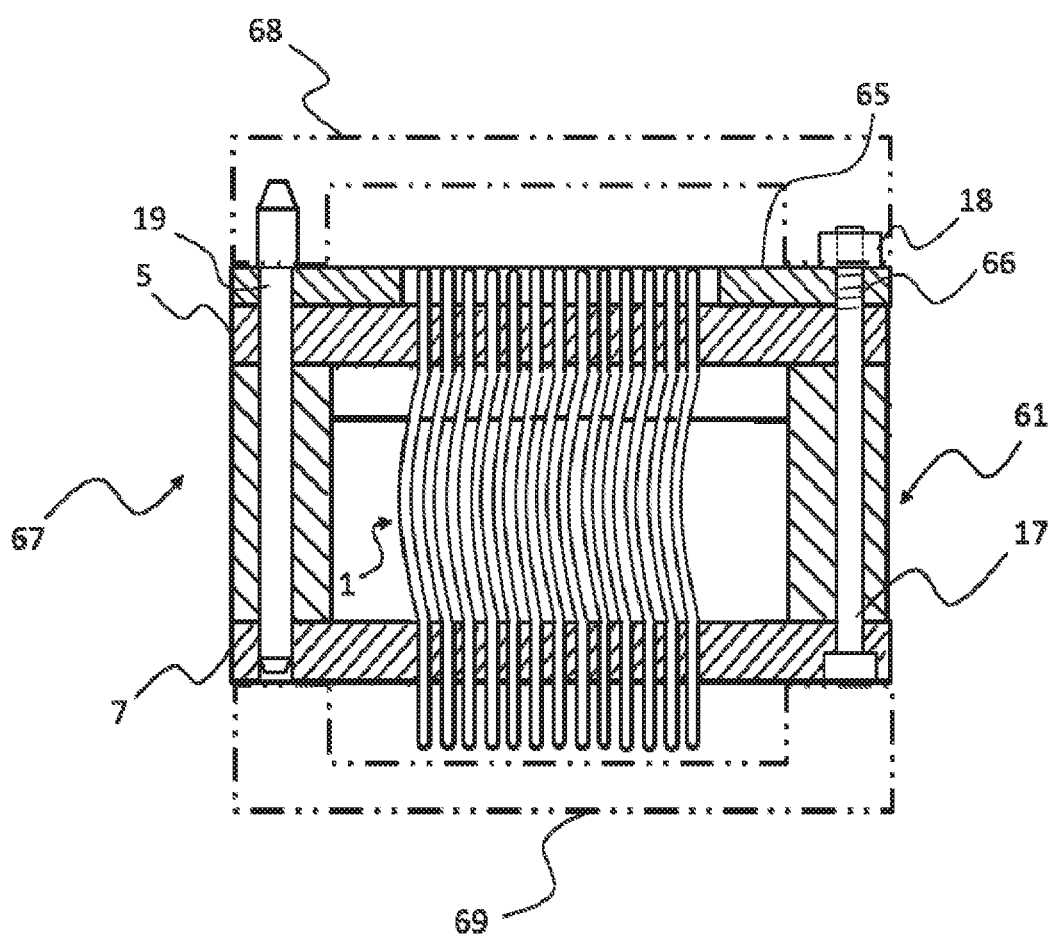
FIG. 9 is an explanatory view of the configuration of the jig according to the present invention and the process of plastically deforming the straight pin inside the jig.

FIG. 9 shows a state in which the suction by the disk-like lower suction plate 34 in FIG. 8 is stopped, the jig set 67 is removed, and the protective caps 68 and 69 for shipping are attached vertically.

Figure 10:
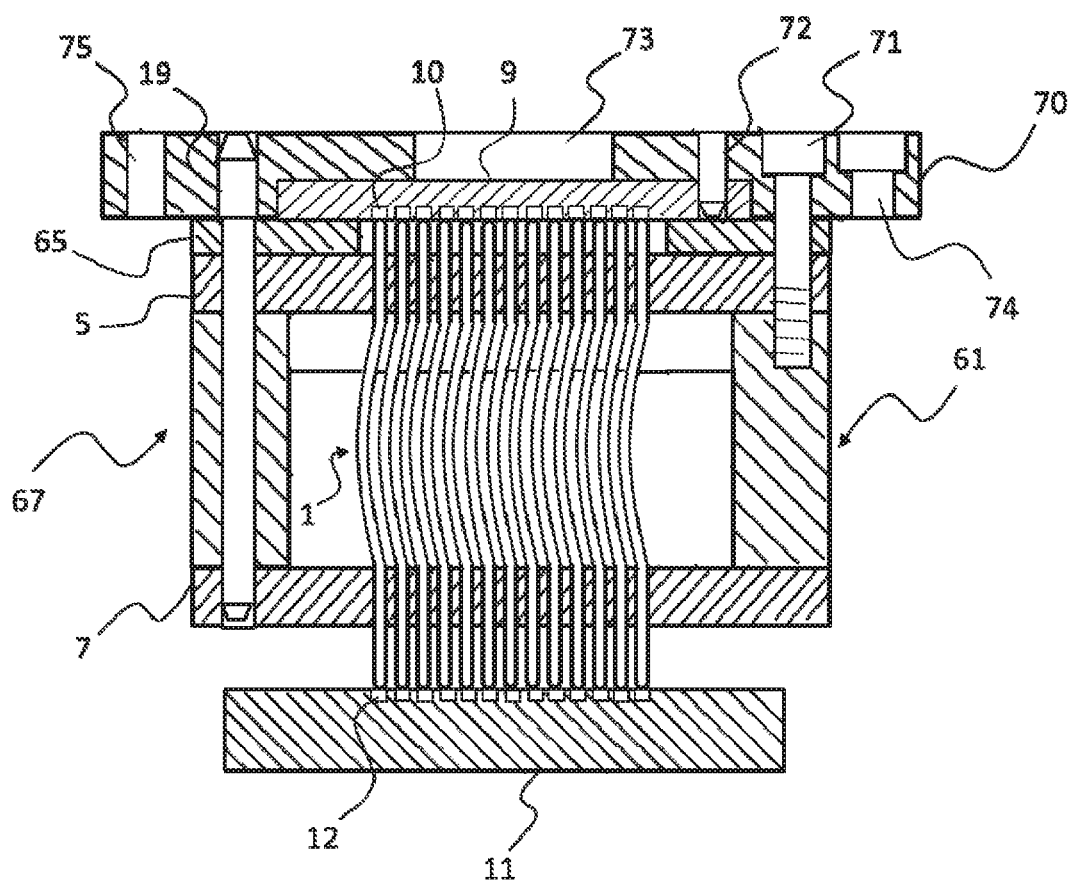
FIG. 10 is an explanatory view of the configuration of the jig according to the present invention and the process of plastically deforming the straight pin inside the jig.
Figures 11A, 11B:
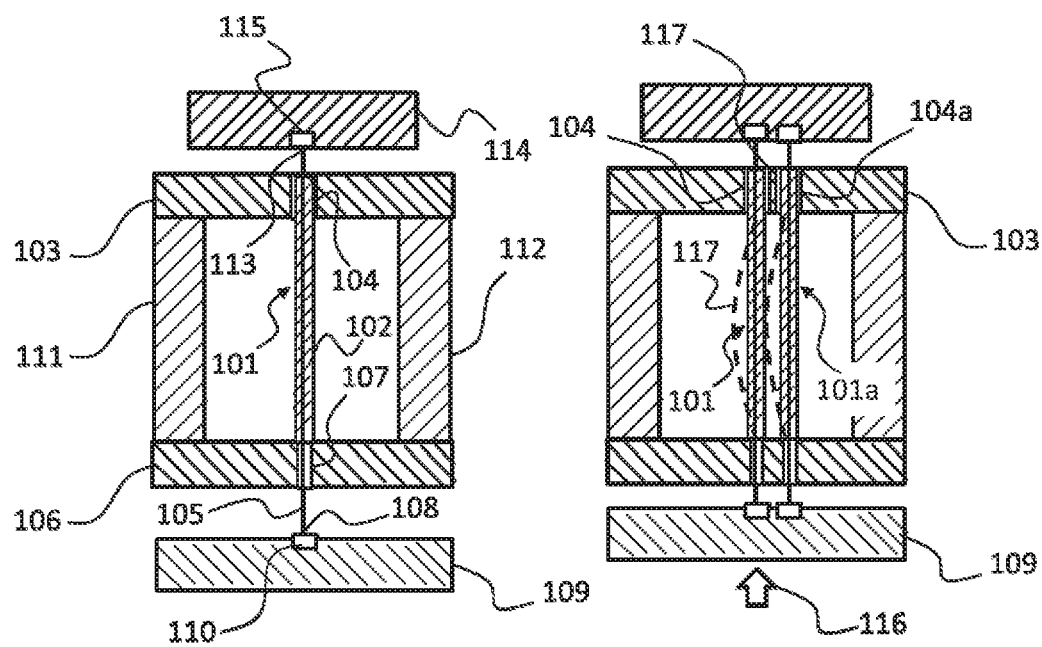
FIGS. 11A and 11B are explanatory views of the structure and operation of a vertical probe called a wire probe, to illustrate configuration and problems of the vertical probe in the prior art.

FIG. 10 shows a state for removing the protective caps 68 and 69 from the shipping jig set 67 shown in FIG. 9 and attaching them to the probe card.

In FIG. 10, the mounting flange 70 is attached to the jig set 67 by a plurality of bolts 71 and is positioned by two positioning pins 19 (although only one is shown).

In FIG. 10, the printed circuit board 9 is incorporated in the mounting flange 70 and positioned by the positioning pin 72. The lower surface of the printed circuit board 9 is in contact with the upper surface of the spacer 65 having the disk-like shape, and the plurality of inspection electrodes 10 are in contact with the upper end parts of the plurality of vertical probes 1.

In FIG. 10, on the upper surface of the mounting flange 70, a wiring hole 73 for passing the electric wiring from the printed circuit board 9 is provided. The mounting flange 70 is provided with a bolt mounting hole 74 and a positioning pin hole 75 so that the mounting flange 70 can be mounted and positioned on a probe card (not shown).

Hereinafter, the advantageous effects of the present invention will be described. The vertical probe and the jig for vertical probes according to the present invention have the following advantageous effects.

First, the handling of narrow pitch can be facilitated. The vertical probe according to the present invention has a bending point on the upper surface of the lower hole plate by plastic working of the vertical probe, the bending point eliminates the need for the insulating coating for preventing falling, so that the insulating coating film having a large thickness does not hinder narrow pitch applications. Further, the probe before being inserted into the jig is a straight pin and can be inserted easily even in the case of a narrow pitch. Also, even if the shape of the probe is changed by plastic deformation inside the jig, all adjacent probes are deformed to the same shape, and interference between adjacent probes does not occur.

Second, the cost reduction and delivery time reduction can be realized. The material of the vertical probe is a straight pin, and since the deformation to the vertical probe is also performed inside the jig, cost reduction and delivery time reduction are possible.

Third, a sufficient flexibility to the contact reaction force from the electrical contact to be inspected, and a sufficient overdrive can be ensured. In the vertical probe according to the present invention, the flexible part has an arched shape. This shape is similar to the shape of the vertical probe cobra described above, and the relationship between the contact force and the overdrive is good in linearity, and sufficient overdrive can be ensured.

Fourth, the upper and lower ends of the plurality of vertical probes 1 are constrained on the same plane and subjected to plastic deformation to be given a curved shape and a bending point due to plastic deformation, since the lower side of the bending point is a stopper on the upper surface of the lower hole plate, the lower end point of the plurality of vertical probes 1 are precisely aligned. That is, the planarity accuracy at the lower end point of the probe is excellent, the contact start of the electrical continuity inspection is aligned, uniform contact force can be realized, and the stability and the reliability of the inspection are improved.

DESCRIPTION OF THE REFERENCE NUMERALS 1, 1*a* . . . vertical probe
2 . . . arch shaped central part
3 . . . upper straight part
4 . . . lower straight part
5 . . . upper hole plate
6 . . . through hole
7 . . . lower hole plate
8 . . . through hole
9 . . . printed circuit board
10 . . . inspection electrode
11 . . . electronic device
12 . . . inspection electrode
13 . . . connecting member
14 . . . connecting member
15 . . . connecting member
16 . . . hollow disk-like spacer
17 . . . bolt
18 . . . nut
19 . . . positioning pin
(20-22: missing number)
23 . . . lower surface of the upper hole plate 5
24 . . . bending point due to plastic deformation
25 . . . upper surface of the lower hole plate 7
26 . . . bending point due to plastic deformation
27 . . . upper suction plate
28 . . . holding member
29 . . . positioning pin
30 . . . bolt
31 . . . annular suction groove
32 . . . exhaust hole
33 . . . positioning pin
34 . . . disk-like lower suction plate
35 . . . support plate
36 . . . positioning pin
37 . . . bolt
38 . . . annular suction groove
39 . . . exhaust hole
40 . . . positioning pin
41 . . . XYZ table
42 . . . bolt
43 . . . straight pin
44 . . . arrow
45 . . . through hole
46 . . . through hole
47 . . . depression bottom surface
48 . . . arrow
49 . . . probe pressing member
50 . . . bolt
51 . . . lower surface of the probe pressing member 49
52 . . . arrow
53 . . . arrow
54 . . . curve
55 . . . arrow
56 . . . arrow
57 . . . curve
58 . . . curve
59 . . . arrow
60 . . . arrow
61 . . . connecting member
62*a* . . . left connecting member
62*b* . . . right connecting member
63 . . . central connecting member
64 . . . (missing number)
65 . . . spacer having a disk-like shape
66 . . . screw hole
67 . . . jig set
68 . . . protective cap
69 . . . protective cap
70 . . . mounting flange
71 . . . bolt
72 . . . positioning pin
73 . . . wiring hole
74 . . . bolt mounting hole
75 . . . positioning pin hole

The invention claimed is:

1. A jig for vertical probe for electrical continuity inspection, wherein means for driving and positioning relative positions of an upper hole plate and a lower hole plate is provided, the upper and lower ends of straight pins as materials of vertical probes are restricted through the through holes provided in the upper and lower hole plates, the positions of the upper and lower hole plates are relatively moved and positioned to buckle and deform the straight pins by compressing in an axial direction so that to plastically deform the straight pins and to make the vertical probe between the upper and lower hole plates is formed into an arched shape, and a vertical probe having a bending point due to plastic deformation is formed in the vicinity of the lower side of the upper hole plate and in the vicinity of the upper side of the lower hole plate.

2. A vertical probe manufactured by the jig according to claim 1, comprising an arched shape between upper and lower hole plates, and a bending point due to plastic deformation is formed in the vicinity of the lower side of the upper hole plate and in the vicinity of the upper side of the lower hole plate.

3. The jig for vertical probe according to claim 2, wherein the relative position of the upper and lower hole plates are corrected by the direction and the amount for releasing the residual strain in order to remove the residual strain causing the spring back, which remains on the vertical probe that has an arched shape between the upper and lower hole plates due to plastic deformation.

* * * * *